United States Patent [19]

Rairden, III

[11] 4,024,294

[45] May 17, 1977

[54] PROTECTIVE COATINGS FOR SUPERALLOYS

[75] Inventor: John R. Rairden, III, Niskayuna, N.Y.

[73] Assignee: General Electric Company, Schenectady, N.Y.

[22] Filed: Mar. 10, 1975

[21] Appl. No.: 556,727

Related U.S. Application Data

[63] Continuation of Ser. No. 392,548, Aug. 29, 1973, abandoned.

[52] U.S. Cl. .................. 427/42; 427/250; 427/252
[51] Int. Cl.² .......................... C23C 13/02
[58] Field of Search .......... 427/250, 383, 328, 252, 427/42; 29/194, 197

[56] References Cited

UNITED STATES PATENTS

| | | | |
|---|---|---|---|
| 2,744,032 | 5/1956 | Highfield | 427/46 |
| 2,855,295 | 10/1958 | Hansel | 75/171 |
| 3,035,934 | 5/1962 | Cape | 75/171 X |
| 3,050,417 | 8/1962 | Nack et al. | 427/318 X |
| 3,338,733 | 8/1967 | Rowady | 427/328 X |
| 3,594,219 | 7/1971 | Maxwell et al. | 29/197 X |
| 3,620,815 | 11/1971 | Blecherman et al. | 427/251 |
| 3,676,085 | 7/1972 | Evans et al. | 427/250 X |
| 3,846,159 | 11/1974 | Bornstein et al. | 29/194 |

*Primary Examiner*—James R. Hoffman
*Attorney, Agent, or Firm*—F. Wesley Turner; Joseph T. Cohen; Jerome C. Squillaro

[57] ABSTRACT

A protective coating is provided for nickel-base and cobalt-base superalloys which is highly resistant to corrosion and oxidation in a fused $Na_2SO_4$ environment at elevated temperatures. The superalloy body is coated by physical vapor deposition with a composition consisting essentially of 50–80% by weight of cobalt and 20–50% by weight of chromium. Optionally, the body may then be coated with an overlayer of aluminum and heat treated to cause interdiffusion of aluminum into the undercoating and thereby enhance the hot corrosion and oxidation resistance of the superalloy body.

15 Claims, 1 Drawing Figure

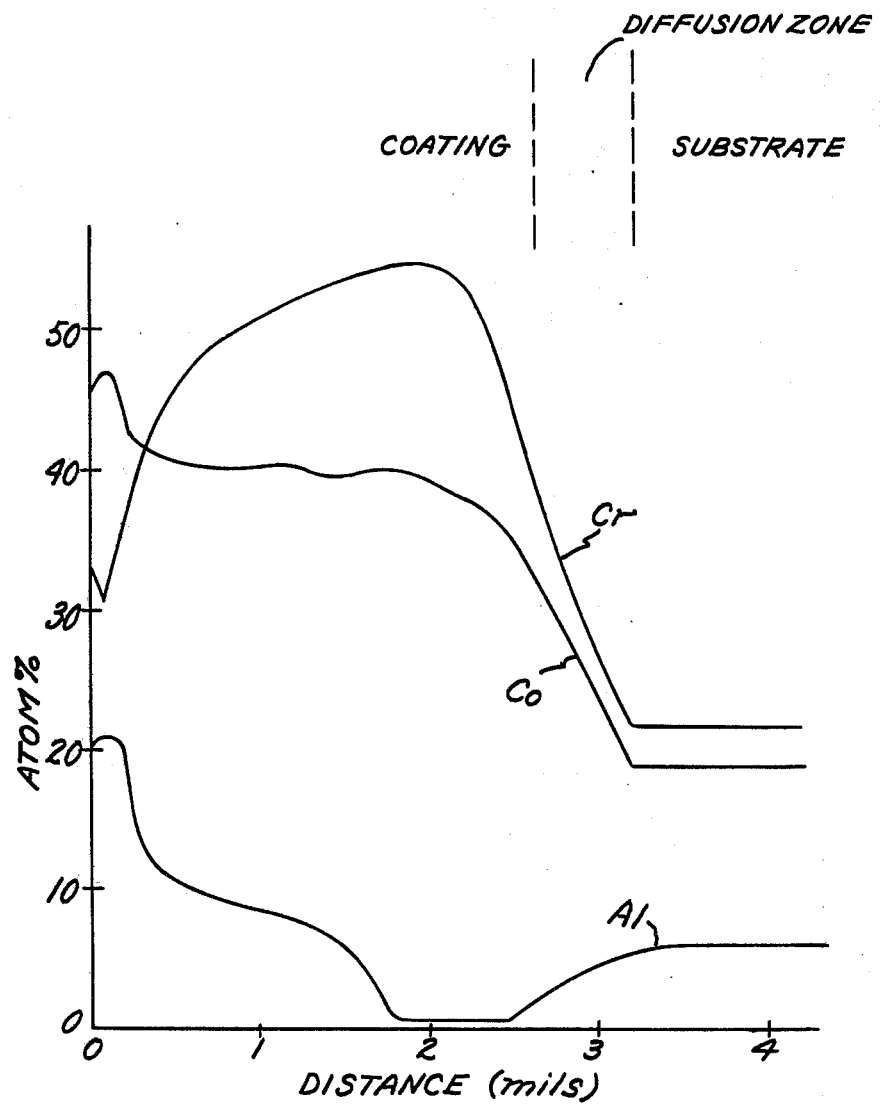

PROTECTIVE COATINGS FOR SUPERALLOYS

This invention was made under Contract with the U.S. Government under Contract 0-35510 with the U.S. Maritime Administration of the Department of Commerce. The U.S. Government is licensed in accordance with the terms of the aforesaid Contract and has reserved the rights set forth in Section 1(f) and 1(g) of the Oct. 10, 1963 Presidential Statement of Government Patent Policy.

This is a continuation, of application Ser. No. 392,548, filed Aug. 19, 1973 and now abandoned.

The superalloys are heat-resistance materials having superior strengths at high temperatures. Many of these alloys contain iron, nickel or cobalt alone or in combination as the principal alloying elements together with chromium to impart surface stability and usually contain one or more minor consitituents, such as molybdenum, tungsten, columbium, titanium and aluminum for the purpose of effecting strengthening. The physical properties of the superalloys make them particularly useful in the manufacture of gas turbine engine components.

Heretofore, surface coatings have been used to protect the superalloy articles from high temperature oxidation and corrosion. Various coatings for superalloys have been described in the literature and of particular interest are coating compositions consisting essentially of chromium, aluminum and, optionally, a member selected from the group consisting of yttrium and the rare earth elements and a metal selected from the group consisting of iron, cobalt and nickel. Cobalt base coatings for superalloys are disclosed by Evans et al. U.S. Pat. No. 3,676,085 which have a composition consisting essentially in weight percent of 15–40% chromium, 10–25% aluminum, 0.01–5% yttrium and the balance cobalt.

The application of such coating compositions to a variety of substrates, such as nickel-base and cobalt-base superalloys may be achieved by physical vapor deposition in a vacuum chamber. During this procedure, a composition is thermally evaporated from a source heated, for example, by an electron beam, and a thin metal coating is condensed on the surface of the workpiece. Layers of the coating are formed as the workpiece is rotated until the thickness is, preferably, in the range of about 1–7 mils. Unfortunately, the deposited coating has radially oriented defects which are the sites of attack by oxidizing and/or corrosive atmospheres at high temperatures. Such defects can lead to premature failure of the coating.

In accordance with the invention, I have discovered a method of improving the oxidation and corrosion resistance of a nickel-base or a cobalt-base superalloy body by coating the body through use of physical vapor deposition with a composition consisting essentially of 50–80% by weight of cobalt and 20–50% by weight of chromium. Optionally, a further improvement in the oxidation and corrosion resistance may be obtained by subsequently coating the body with an overlayer of aluminum and subjecting the body to a heat treatment to cause interdiffusion of the aluminum into the undercoating. The concentration profile of this system having the aluminum overlayer indicates the presence of a high concentration of aluminum on the outer surface at the coating which substantially contributes to the improved properties. The coated superalloy bodies prepared by my invention are particularly useful in making gas turbine engine components.

The accompanying drawing is a microphone profile of a superalloy body coated by physical vapor deposition with Co-35Cr, then coated with an overlayer of aluminum, and subjected to a heat treatment to cause interdiffusion of aluminum into the undercoating.

Referring now to the drawing, the electron microprobe analysis reveals that this coating has pronounced compositional gradients of the elements Cr, Al and Co. These compositional gradients are believed to be highly advantageous in providing a protective coating system as compared with the prior art wherein the CoCrAlY coating was substantially of a homogeneous composition. The advantages of the composition gradients obtained by this process can be understood in terms of the required chemical and physical properties of a useful coating.

First, the chemical requirements of the coating are that a thin, continuous, protective film of $Al_2O_3$ or $Cr_2O_3$ must be formed. Alternatively, a spinel-type oxide film such as $CoAl_2O_4$ or $CoCr_2O_4$ can also be highly protective. By providing for a high concentration of Al in the outer region of the coating, such as is done by the duplexing process, the formation of a highly protective $Al_2O_3$ film is promoted. Secondly, the mechanical property requirements of the coating are that it resist cracking and spalling. The high aluminum content of homogeneous CoCrAlY coatings leads to coating brittleness and a strong tendency to crack. Such cracks can propagate into the substrate material and lead to premature failure of the coated article. However, the graded composition coating provides for a lower aluminum (inner) region which is substantially tougher and more ductile than the high aluminum outer region and hence, this tougher inner region should retard crack propagation from the coating to the substrate. Therefore, the graded composition concept described here is expected to enhance both the chemical and mechanical properties of the coating.

The nickel-base superalloys are strong, high temperature materials which are particularly useful in gas turbine engine. A substantial listing of these materials is set forth by W. F. Simmons, *Compilation of Chemical Compositions and Rupture Strengths of Superalloys*, ASTM Data Series Publication No. DS9E, and may be represented by the nominal compositions in weight percent of the following superalloys:

| Ingredient | Rene 80 | Rene 100 | IN-738 | Udimet 500 |
|---|---|---|---|---|
| C | 0.17 | 0.18 | 0.17 | 0.08 |
| Mn | 0.2 | 0.50 | 0.20 | 0.75 |
| Si | 0.2 | 0.50 | 0.30 | 0.75 |
| Cr | 14.0 | 9.5 | 16.0 | 19.0 |
| Ni | Bal. | Bal. | Bal. | Bal. |
| Co | 9.5 | 15.0 | 8.5 | 18.0 |
| Mo | 4.0 | 3.0 | 1.75 | 4.0 |
| W | 4.0 | — | 2.6 | — |
| Cb | — | — | 0.9 | — |
| Ti | 5.0 | 4.20 | 3.4 | 2.9 |
| Al | 3.0 | 5.50 | 3.4 | 2.9 |
| B | 0.015 | 0.015 | 0.01 | 0.005 |
| Zr | 0.03 | 0.06 | 0.10 | — |
| Fe | 0.2 | 1.0 max. | 0.50 | 4.0 |
| Other | — | 1.0 V | 1.75 Ta | — |

The cobalt-chromium coating consists essentially of 50–80% by weight of cobalt and 20–50% by weight of chromium. A preferred composition is 65% by weight of cobalt and 35% by weight of chromium which is designated as Co-35Cr. This composition was found to perform the best during high temperature oxidation and corrosion tests. When the amount of cobalt exceeds 80%, the oxidation resistance is unsatisfactory because there is insufficient Cr present to form a protective film of $Cr_2O_3$, whereas when amount of cobalt is below 50%, the coating becomes excessively brittle and fails by cracking and spalling from the substrate. Correspondingly, the amount of chromium should not exceed 50% to prevent excessive brittleness while less than 70% leads to poor oxidation resistance. The cobalt-chromium coating is applied to the substrate by a physical vapor deposition technique which is described in considerable detail in *Vapor Deposition*, Edited by C. F. Powell et al., John Wiley & Sons, New York (1966). Accordingly, the coating is evaporated and deposited in a vacuum chamber. Typically, the metal alloy is heated by an electron beam focused on the metal alloy ingot to evaporate the metal to a vapor. During evaporation, the vapor condenses as a coating, preferably about 1-7 mils in thickness on the workpiece being coated. The material to be applied is heated in a high vacuum to a temperature at which its vapor pressure is about $10^{-2}$ torr or greater whereupon it emits molecular rays in all directions. During coating the vacuum must be very high to permit the molecular rays to travel from their source without disturbance until they hit the surface of the object to be coated.

Then, optionally the first coating may be overcoated with a layer of aluminum, preferably 0.1 to 3.0 mils thick, by either physical vapor deposition or chemical vapor deposition. In a preferred embodiment, the aluminum layer is deposited by evaporation from an electron beam heated source as described in my copending application Ser. No. 390,550, filed Aug. 22, 1973. This technique is particularly useful because the aluminum layer can be deposited in the same equipment used to deposit the cobalt-chromium by simple substitution of an aluminum source.

Alternatively, the aluminide coating may be applied to the superalloy substrate by chemical vapor deposition using a technique designated as pack cementation. This involves placing in a metal or graphite retort a mixture of an inert oxide filler or diluent, a halide salt and a source of aluminum. The inert filler supports the article to be coated and the retort is usually sealed with sand or low melting glass powder. On heating, the salt decomposes and reacts with the aluminum to form a gaseous aluminum halide which serves to transfer the aluminum to the surface of the superalloy. A preferred type of aluminide pack cementation coating useful in the present invention is the high activity pack containing about 3-20 percent by weight of aluminum. The most practical activator is a halide salt selected from NaF, KF, $NH_4Cl$ and $NH_4F$ in an amount of about 0.1-10% by weight of the mixture. The preferred inert filler is a refractory alumina powder which comprises about 10-96% by weight of the total pack. A representative pack contains in weight percent of about 5.8% Al, 0.2% $NH_4F$ and the balance $Al_2O_3$.

Thereafter, the coated body is subject to a heat treatment to cause interdiffusion of the aluminum overlayer into the first coating layer whereby the aluminum combines with the first coating to form a higher melting alloy. The minimum temperature for the heat treatment is about 950° C., while the maximum temperature depends upon the superalloy substrate, since it is undesirable to heat above the solutionizing heat treatment of the alloy involved. For nickel-base superalloys this tends to be in the range of about 1040°-1230° C. The heat treatment of cobalt-base alloys is much less complex than for nickel-base alloys and high temperature solution heat treatments are usually at about 1150° C. The time of heat treatment is preferably in the range of about 0.25-5 hours. To avoid premature oxidation of the duplex coating surface prior to interdiffusion, the heat treatment should be performed in an inert atmosphere, e.g. helium, argon.

My invention is further illustrated by the following examples:

EXAMPLE I

Using conventional techniques and equipment as described hereinabove, a coating 3 mils thick was deposited on a Udimet 500 nickel-base superalloy pin by vacuum evaporation from a Co-35Cr source. The electron beam heating technique was used to evaporate the source alloy. The coating was deposited on the rotating pin positioned 4 inches from the source in 36 minutes using a beam power of 4.0 KW. It was found that this coating is nearly comparable in hot corrosion resistance to a pin similarly coated from a Co-22Cr-13Al-1Y source as measured by a burner rig test. This test involves burning a mixture of diesel oil plus 1% sulfur plus 467 ppm. sea salt in 1600° F.

EXAMPLE II

Following the procedure of Example I, a coating 3 mils thick was deposited onto a Udimet 500 nickel-base superalloy cast pin by electron beam evaporation from a Co-35Cr source. The deposition time was 25 min., the deposition temperature was 780° C. and, the deposition power was 3.9 KW. The sample was cooled to room temperature in the vacuum chamber, then the chamber was opened and a pure aluminum source was substituted for the alloy source. The system was evacuated and a coating of aluminum 0.5 mil thick was deposited in 10 min., the deposition temperature was 400° C., and the deposition power was 4.7 KW.

Segments were cut from the pin and heat treated for 30 min. at 1200° C. in air to interdiffuse the two coating layers. It was shown by electron microprobe analysis as illustrated by the drawing that a graded composition coating was achieved.

A sample was then subjected to a high pressure burner rig test during which the sample was held in a gas stream for 100 hours at 1650° F. The fuel contained 60 ppm Na, 300 ppm V and 900 ppm Mg. Nutshell cleaning was done three times during the run at 23 hours, 76 hours, and 100 hours. This sample was examined metallographically and was found to have eroded 0.4 to 0.8 mil to the direct blast of the gas stream. A similar sample coated with Co-22Cr-13Al-ly eroded to 1.0 to 1.4 mils during this same test run.

Another group of samples was subjected to a burner rig test which simulated conditions used in a marine gas turbine engine under highly corrosive conditions. The test was run to coating failure using a diesel fuel containing 1% by weight of sulfur and 467 ppm sea salt at a temperature of 1600° F. with thermal cycling to room temperature three to five times per week. The hot corrosion was determined in mils per hour and the results are shown in the table below:

| Hot Corrosion Rate (mils/hr.) | | |
| --- | --- | --- |
| | Substrate | |
| Coating | Udimet-500 | IN-738 |
| Uncoated | $25 \times 10^{-3}$ | $33 \times 10^{-3}$ |
| Co-35Cr | $1.39 \times 10^{-3}$ | $1.89 \times 10^{-3}$ |
| Co-35Cr + Al | $0.89 \times 10^{-3}$ | $< 2.0 \times 10^{-3}$ |

These results indicate that the Co-35Cr coating greatly improves the hot corrosion resistance of nickel-base superalloy substrates. Furthermore, the effect of aluminizing to improve the hot corrosion properties varies with the substrate and corrosive environment of the test.

It will be appreciated that the invention is not limited to the specific details shown in the examples and illustrations and that various modifications may be made within the ordinary skill in the art without departing from the spirit and scope of the invention.

I claim:

1. A method of improving the high temperature oxidation and corrosion resistance of a nickel-base or cobalt-base superalloy containing 9.5–19.0 percent chromium comprising coating said superalloy by physical vapor deposition with a composition consisting of, on a weight percent basis, from 50% cobalt and 50% chromium to 80% cobalt and 20% chromium.

2. The claim 1 method wherein said superalloy is a cobalt-base superalloy.

3. A method of improving the high temperature oxidation and corrosion resistance of a nickel-base superalloy containing 9.5–19.0 percent chromium comprising coating said superalloy by physical vapor deposition with a composition consisting of, on a weight percent basis, from 50% cobalt and 50% chromium to 80% cobalt and 20% chromium.

4. The claim 3 method wherein said coating has a thickness of 1–7 mils.

5. The claim 4 method wherein said superalloy contains 9.5–19.0% chromium, 8.5–18% cobalt, 2.9–5.5% aluminum, 2.9–5.0% titanium, 1.75–4.0% molybdenum, 0–4% tungsten, 0–1.75% tantalum, and 0–1% of vanadium, 0.08–0.18% carbon, 0.2–0.75% manganese, 0.2–0.75% silicon, 0–0.9% niobium, 0.2–0.50% iron, 0.005–0.015% boron, 0–0.1% zirconium, and the balance being essentially nickel.

6. The claim 5 method wherein said superalloy contains 16% chromium, 8.5% cobalt, 3.4% aluminum, 3.4% titanium, 1.75% molybdenum, 2.6% tungsten, and 1.75% tantalum.

7. A method of improving the high temperature oxidation and corrosion resistance of a nickel-base or cobalt-base superalloy containing 9.5–19.0 percent chromium comprising the steps of:

a. coating the superalloy body by physical vapor deposition with a first coating of a composition consisting of, on a weight percent basis, from 50% cobalt and 50% chromium to 80% cobalt and 20% chromium, b. subjecting the coated body to a overcoat of aluminum, and c. heat treating the duplex coating to cause interdiffusion of aluminum with the first coating to increase the oxidation and corrosion resistance of the coating.

8. The claim 7 method wherein said superalloy is a cobalt-base superalloy.

9. A method of improving the high temperature oxidation and corrosion resistance of a nickel-base superalloy containing 9.5–19.0 percent chromium comprising the steps of:

a. coating the superalloy body by physical vapor deposition with a first coating of a composition consisting of, on a weight percent basis, from 50% cobalt and 50% chromium to 80% cobalt and 20% chromium, b. subjecting the coated body to an overcoat of aluminum, and c. heat treating the duplex coating to cause interdiffusion of aluminum with the first coating to increase the oxidation and corrosion resistance of the coating.

10. The claim 9 method wherein the first coating has a thickness of 1–7 mils and the overcoating has a thickness of 0.1–3.0 mils.

11. The claim 10 method wherein said superalloy contains 9.5–19.0% chromium, 8.5–18% cobalt, 2.9–5.5% aluminum, 2.9–5.0% titanium, 1.75–4.0% molybdenum, 0–4.0% tungsten, 0–1.75% tantalum, and 0–1% of vanadium, 0.08–0.18% carbon, 0.2–0.75% manganese, and 0.2–0.75% silicon, 0–0.9% niobium, 0.2–0.50% iron, 0.003–0.015% boron, 0–0.1% zirconium, and the balance being essentially nickel.

12. The claim 11 method wherein said superalloy contains 16% chromium, 8.5% cobalt, 3.4% aluminum, 3.4% titanium, 1.75% molybdenum, 2.6% tungsten, and 1.75% tantalum.

13. The claim 10 method wherein the overcoating is applied by pack cementation.

14. The claim 10 method wherein the overcoating is applied by electron beam evaporation.

15. The claim 10 method wherein the heat treatment is at a temperature of 1040–1230° C. for 0.25–5 hours in an inert atmosphere.

* * * * *

UNITED STATES PATENT AND TRADEMARK OFFICE
CERTIFICATE OF CORRECTION

PATENT NO. : 4,024,294
DATED : May 17, 1977
INVENTOR(S) : John R. Rairden, III

It is certified that error appears in the above-identified patent and that said Letters Patent are hereby corrected as shown below:

Column 6, line 40, claim 11, "0.003-0.015% boron" should read --0.005-0.015% boron.

Signed and Sealed this

Sixteenth Day of May 1978

[SEAL]

Attest:

RUTH C. MASON
Attesting Officer

LUTRELLE F. PARKER
Acting Commissioner of Patents and Trademarks